United States Patent [19]
Hikita et al.

[11] Patent Number: 4,734,664
[45] Date of Patent: Mar. 29, 1988

[54] SURFACE ACOUSTIC WAVE RESONATOR

[75] Inventors: Mitsutaka Hikita, Hachioji; Atsushi Sumioka, Kodaira; Yoshikatu Ishida, Ibaraki, all of Japan

[73] Assignees: Hitachi, Ltd.; Hitachi Denshi Kabushiki, both of Japan

[21] Appl. No.: 844,104

[22] Filed: Mar. 26, 1986

[30] Foreign Application Priority Data

Mar. 27, 1985 [JP] Japan .................................. 60-60645

[51] Int. Cl.[4] .......................... H03H 9/64; H03H 9/25
[52] U.S. Cl. .................................... 333/193; 333/154; 333/194; 310/313 R
[58] Field of Search .............................. 333/150–155, 333/193–196; 29/25.35; 310/313 R, 313 A, 313 B, 313 C, 313 D; 331/96, 107 A, 155

[56] References Cited

U.S. PATENT DOCUMENTS

| 4,126,837 | 11/1978 | Koyamada et al. | 333/193 |
| 4,166,258 | 8/1979 | Tseng | 333/195 |
| 4,405,874 | 9/1983 | Suthers | 310/313 B |
| 4,423,395 | 12/1983 | Shirahama | 333/194 X |
| 4,625,184 | 11/1986 | Niitsuma et al. | 333/193 X |

FOREIGN PATENT DOCUMENTS 2950896 6/1981 Fed. Rep. of Germany .
2392538 12/1978 France .

OTHER PUBLICATIONS

Yamaguchi et al.–"Design of Surface Acoustic-Wave-Filters by Taking Account of Electrical Terminations and Matching Circuits", Electronic Letters, vol. 12, No. 8, 15 Apr. 1976; pp. 181–182.
Patent Abstracts of Japan, vol. 9, No. 244, (E-346)(1967), 30 Sep. 1985, JP-A-60 94520, (Fujitsu K.K.), 27-05-1985; 1 page.
European Search Report, Application Number EP 86 10 4081, The Hague, Date of Completion of the Search, 01-10-1987; 2 pages.

Primary Examiner—Marvin L. Nussbaum
Attorney, Agent, or Firm—Antonelli, Terry & Wands

[57] ABSTRACT

In order to realize an SAW filter withstanding high power, a plurality of single open-ended surface acoustic wave resonators are connected in series, and an earth conductor is disposed at least on a part of rear face of a piezoelectric substrate constituting the surface acoustic wave resonators. And static capacities formed between said earth conductor and electrode conductors on the piezoelectric substrate constituting the surface acoustic wave resonators are utilized as constituents of the filter circuit. In the above described structure, a part of input power is not converted into acoustic energy, but directly transmitted to the output side. Since the mechanical stress imposed upon the electrode material and the piezoelectric substrate is thus lightened, the SAW filter can withstand a large power signal.

6 Claims, 12 Drawing Figures

SURFACE ACOUSTIC WAVE RESONATOR

BACKGROUND OF THE INVENTION

The present invention relates to a surface acoustic wave resonator, and in particular to the structure of a bandpass filter or a bandrejection filter having a plurality of transducers, each of which is composed of interdigital finger electrodes disposed on a piezoelectric substrate.

As described above, the surface acoustic wave resonator is composed of transducers having simple-shaped thin metal conductors disposed on the piezo-electric substrate. Accordingly, it is advantageously possible to realize an extremely small-sized resonator having stable characteristics.

Such a surface acoustic wave resonator must have low loss and sharp cutoff in frequency response as the principal characteristics. In other words, the attenuation characteristics must be able to change sharply between the passband and the rejection band (stopband). In addition, the power-resisting property has become especially noticeable recently. That is to say, it has become important for the surface acoustic wave resonator to operate as a predetermined filter in response to a large power signal.

Although various surface acoustic wave resonators are heretofore known, the power-resisting property has not been considered satisfactory. In some resonators, an improved electrode material is used to enhance the power-resisting property. Nevertheless, the surface wave acoustic resonators now under development are 0.5 W or less in rated power.

SUMMARY OF THE INVENTION

Therefore, an object of the present invention is to provide a surface acoustic wave resonator which is excellent in power-resisting property, i.e., a surface acoustic wave resonator which can be used for a signal exceeding several watts in power.

In accordance with the present invention, therefore, a plane conductor serving as an earth electrode is formed on one surface of a piezoelectric substrate, and a plurality of surface acoustic wave resonators (SAW's) are formed on the other surface of the piezoelectric substrate and are connected in series. In addition matching networks are connected between an input terminal of a SAW filter having surface acoustic wave resonators thus serially connected and the above described earth electrode and between an output terminal of the SAW filter and the earth electrode, respectively.

In the above described structure, a part (high frequency components) of the input power is not converted into the acoustic energy, but directly transmitted to the output side or allowed to flow into the earth electrode as will be evident from the following description. Accordingly, the electrode material and the mechanical stress imposed upon the substrate are reduced. Therefore, a surface acoustic wave resonator withstanding a signal having large power (2 to 4 watts, for example) can be realized.

The above-mentioned and other features and objects of this invention will become more apparent by reference to the following description taken in conjunction with the accompanying drawings.

DETAILED DESCRIPTION OF PRESENTLY PREFERRED EMBODIMENTS

Figure 1A:
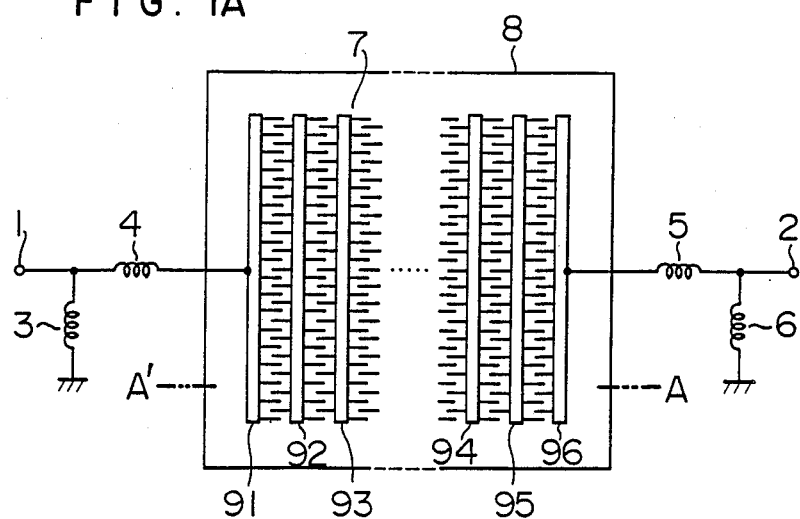
FIGS. 1A and 7 show structures of embodiments of an SAW filter according to the present invention.

Referring to FIG. 1A, reference numerals 1 and 2 denote a signal input terminal and an output terminal of a resonator. On a piezoelectric substrate 8, common electrodes 91 to 96 are disposed in parallel. Finger or interdigital electrodes connected to adjacent common electrodes 9 are mutually and alternately interposed. The common electrode 91 forms an input terminal. A matching circuit for input load composed of inductance elements 3 and 4 is formed between the common electrode 91 and the signal input terminal 1. The common electrode 96 forms an output terminal. A matching circuit for output load composed of inductance elements 5 and 6 is formed between the common electrode 96 and the resonator output terminal 2.

Figure 1B:
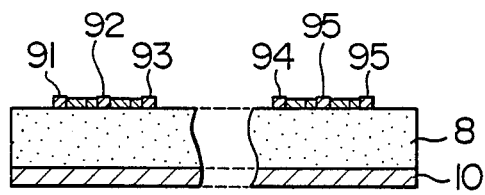
FIG. 1B is a sectional view seen along a broken line of FIG. 1A.

FIG. 1B is a side sectional view of FIG. 1A seen along a line A—A. Identical reference numerals are employed in FIG. 1B to designate elements corresponding to elements of FIG. 1A. On one surface of the piezoelectric substrate, i.e., on the rear face of the piezo-electric substrate, an earth metal conductor 10 is formed at all positions or at least positions corresponding to the above described common electrodes 91 to 96 and their finger or interdigital electrodes. Therefore, capacitors are formed between the earth metal conductor and electrodes 91 to 96.

Figure 2:
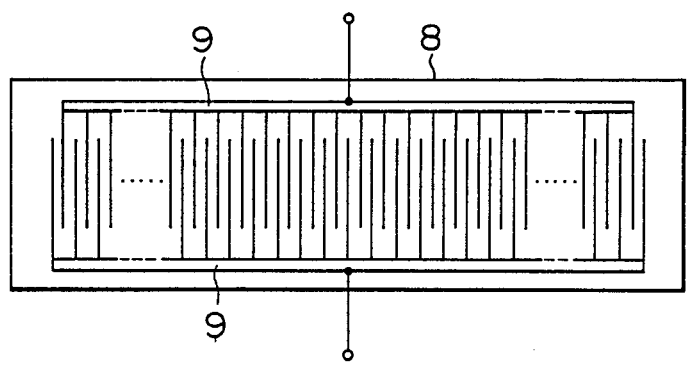
FIG. 2 shows a structure of a part of the embodiment illustrated in FIG. 1A.

Between two common electrodes adjoining each other in the above described structure, a one-part resonator made with interdigital or finger electrodes as shown in FIG. 2 is formed. When the number of pairs of interdigital or finger electrodes in a transducer is thus larger, the acoustic energy is shut in due to inner reflection caused by finger electrodes of the transducers themselves even if reflectors are not disposed at both sides. As a result, a resonator is formed.

Figure 3A:
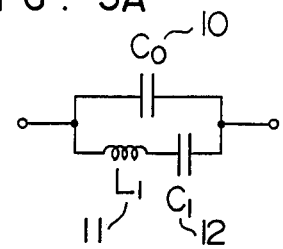
FIG. 3A is an equivalent circuit diagram of a resonator illustrated in FIG. 2.
Figure 3B:
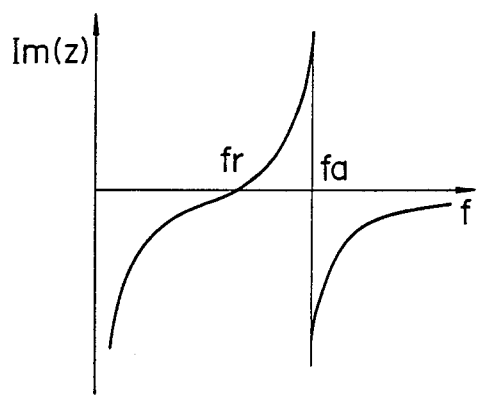
FIG. 3B shows a frequency response of the circuit illustrated in FIG. 3A.

FIG. 3A shows the electrical equivalent circuit of the resonator illustrated in FIG. 2. In general, a surface acoustic wave resonator is represented by electrostatic capacitance Co between electrodes, which is connected in parallel with a series circuit of inductance $L_1$ and capacitance $C_1$ formed by resonance. The impedance characteristics of such a resonator are shown in FIG. 3B. The impedance of the resonator becomes zero at the resonance frequency $f_r$ and becomes substantially infinite at the antiresonance frequency $f_a$.

Figure 4:
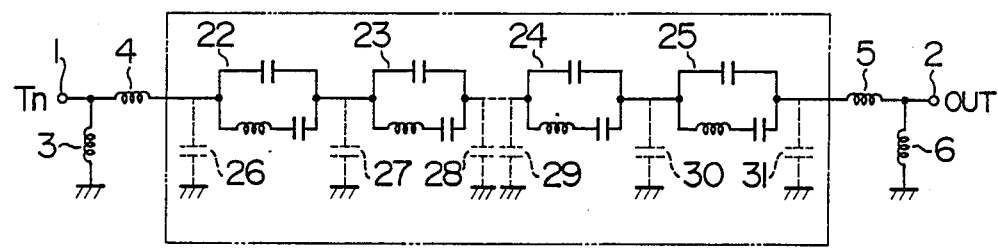
FIG. 4 is an equivalent circuit diagram of FIG. 1A.

Therefore, the surface wave acoustic resonator illustrated in FIG. 1A can be represented by an equivalent circuit of FIG. 4.

In the same way as FIG. 1A, a parallel inductor 3 and a series inductor 4 connected to an input terminal 1 as well as a parallel inductor 6 and a series inductor 5 connected to an output terminal 2 represent external matching circuits. The equivalent circuit of FIG. 3A is used in the surface acoustic wave resonator.

Static capacities 26 to 31 represented by broken lines represent capacities of the electrodes coupling finger electrodes and resonators together and input and output terminal electrodes with respect to the common earth (10 in FIG. 1B). These capacities are represented by broken lines in FIG. 4 and can be arbitrarily set by increasing or decreasing the area of the electrode coupling resonators together or the input/output terminal electrode such as a bonding pad. Alternatively, these capacities, can also be arbitrarily set by changing the thickness of the piezoelectric substrate 8. In addition, these capacities may also be formed by chip capacitors disposed outside as occasion demands.

Figure 5A:
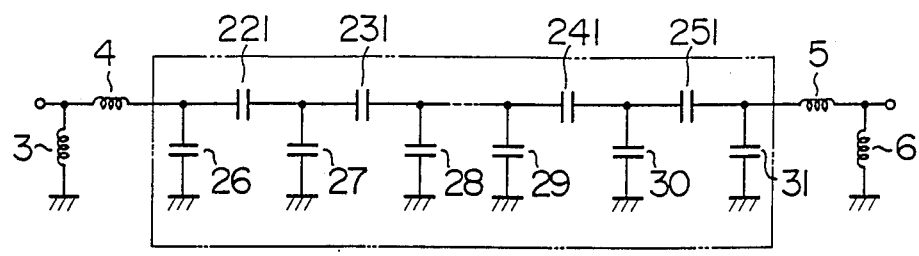
FIGS. 5A to 5D show equivalent circuit diagrams for respective frequency bands.

At a frequency lower than the resonance frequency $f_r$, the impedance of each resonator substantially becomes only the capacity between electrodes (22, 23, 25) as evident from the equivalent circuit of FIG. 4. At a frequency lower than the resonance frequency $f_r$, therefore, the electrical equivalent circuit of the configuration of FIG. 1A is represented by FIG. 5A where the electrodes are represented by the numerals 221, 231, ---, 251. At a frequency near the resonance frequency $f_r$, each resonator approaches a series circuit of inductance and capacitance (222, 232, ---, 252) due to resonance, resulting in an electrical equivalent circuit of FIG. 5B. At a frequency near the antiresonance frequency $f_a$, each resonator approaches a parallel circuit (22, 23, ... , 25) composed of capacitance between electrodes and inductance due to antiresonance, resulting in an electrical equivalent circuit of FIG. 5C. At a frequency sufficiently higher than the antiresonance frequency $f_a$, each resonator is represented only by the capacity between electrodes again, resulting in an electrical equivalent circuit of FIG. 5D. Reference numerals 26, 27, 28, 29, 30, and 31 denote equivalent capacities between electrode conductors of transducers and the common earth conductor 10.

The reason why the structure of FIG. 1A acts as a bandpass filter or a bandrejection filter will now be described. The case where the passband of the filter is set around the resonance frequency or at frequencies lower than the resonance frequency will now be described.

Figure 5B:
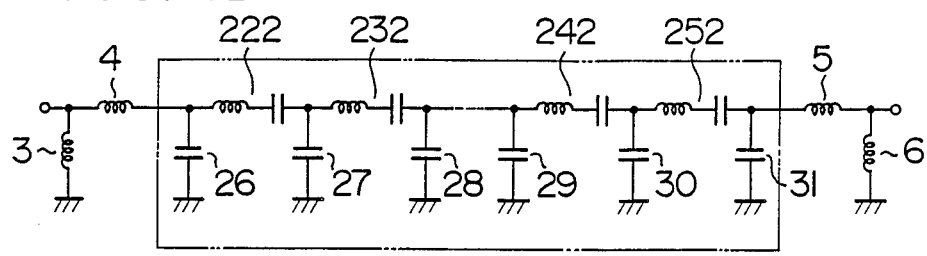

In general, it is desirable in such a structure to set the passband of the filter near the resonance frequency. In this band, FIGS. 5A and 5B are simplified and are approximated to FIG. 5D. That is to say, the surface acoustic wave resonator can be represented simply by the capacity with respect to the common earth, and hence it is always possible to match external circuits to the input and output loads.

Figure 5C:
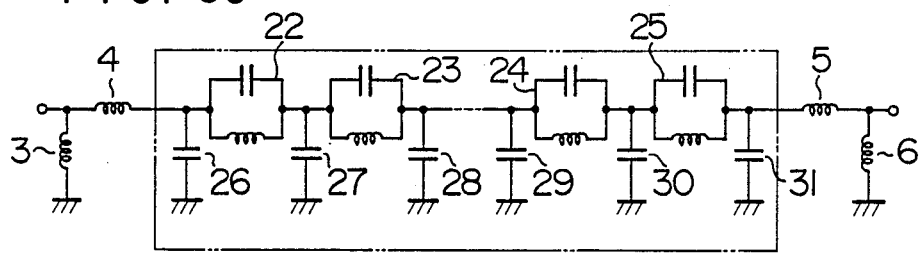
Figure 5D:
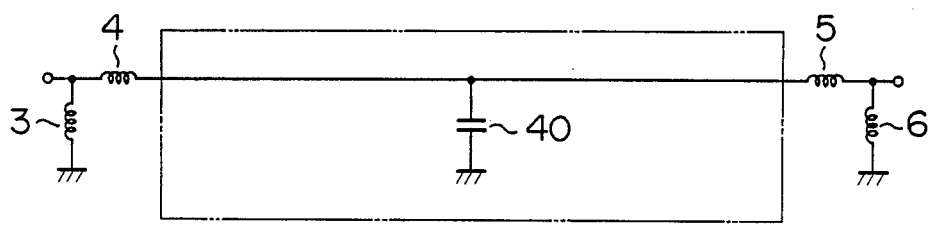

At frequencies lower than the pass band, the effect of the series capacities becomes relatively large, resulting in the stopband of the filter. At frequencies higher than the passband, i.e., at frequencies near the antiresonance frequency, the filter is represented by FIG. 5C. Since the impedance of the surface acoustic wave resonator becomes substantially infinite due to antiresonance, the frequencies higher than the passband belong to the stopband of the filter. At frequencies sufficiently higher than the passband, the filter can be simplified again as shown in FIG. 5D. Since the effect of the capacity with respect to the common earth becomes relatively large, however, the filter comes into the stopband again.

Since the passband is located near the resonance frequency and the stopband is located near the antiresonance frequency in the above described structure, the structure is suitable as a bandpass filter or a band rejection filter which must have very steep rise characteristics at the higher frequency side with respect to the passband.

Figure 6:
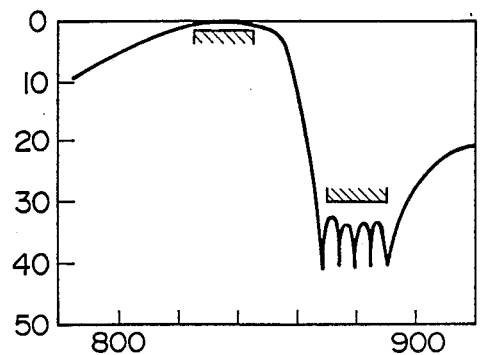
FIG. 6 shows frequency characteristics of an embodiment of an SAW filter according to the present invention.

FIG. 6 shows an example of frequency response of an embodiment of a filter according to the present invention. As the surface acoustic wave resonator, a interdigital transducer having 400 pairs was used. As the piezoelectric substrate, 36° rotated Y cut X propagation Li-TaO$_3$ was used. On the surface of the substrate, 20 surface acoustic wave resonators, electrode patterns for connecting the resonators in series, and bonding pads were formed. The thickness of the substrate was chosen to be 0.35 mm so that the finger electrodes, connection electrode parts, and the bonding pads may have desired capacitance values.

For the frequency response, a transmission filter for mobile telephone having the passband of 825 to 845 MHz and the stopband of 870 to 890 MHz was used. In order to attain the steep rise at the high frequency side and wide width of the stopband, 20 surface acoustic wave resonators were divided into 10 groups and the antiresonance frequencies (resonance frequencies) of respective groups were somewhat staggered. As external matching circuits, a series inductor and a parallel inductor was used for each of the input and output as illustrated in FIG. 1A.

As shown in FIG. 6, the resultant loss in the passband (825 to 845 MHz) was 0.5 dB or less, and the loss in the stopband (870 to 890 MHz) was 30 dB or more. Very steep rise transition which had been difficult to realize in the surface acoustic wave filter of the prior art was thus achieved. Recently, the handling power (pass power) has become one of parameters representing the quality of a filter. Advantageously, the filter according to the present invention has very large handling power. Experimental results, showed that the filter sufficiently withstood the pass power exceeding 30 dBm.

The first reason why the pass power is very large is that the input power can be dispersed over a wide range because a very large number of pairs of transducers are used as the surface acoustic wave resonator. The second reason is that the loss in the passband is very small.

When large power having a frequency $f_T$ is applied to a surface acoustic wave filter, harmonics such as $2f_T$ and $3f_T$ are in general produced due to the nonlinear effect of the acoustic vibration. However, the present filter has a very small nonlinear effect so that harmonics such as $2f_T$ and $3f_T$ could not be observed by using a usual spectrum analyzer for pass power of 30 dBm or more.

In the above description of the structure of FIG. 1, a steep stopband was located at the higher frequency side of the passband. When a stopband is located at the lower frequency side of the passband, it is necessary to set the antiresonance frequency of the surface acoustic wave resonator at the lower frequency side of the passband and effect matching at the passband by using external circuits. The computer simulation results show that a similar filter is realized although the loss of the passband is somewhat increased as compared with the case where the stopband is located at the higher frequency side.

Figure 7:
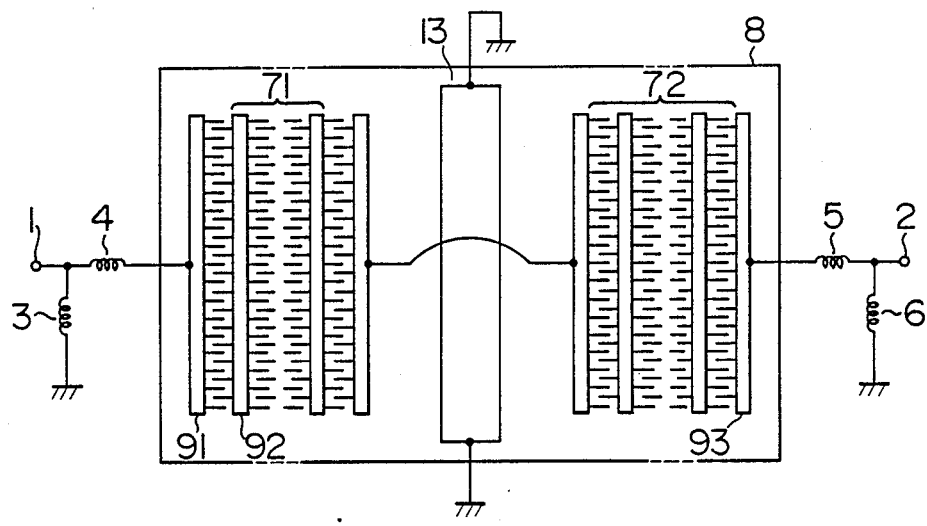

FIG. 7 shows another embodiment of a surface acoustic wave filter according to the present invention. In order to improve isolation between the input and output, the filter is divided into a plurality of filters 71 and 72 with an earth electrode 13 inserted between them and the filters are connected by the wire bonding, crossover pattern or the like as shown in FIG. 7. A similar effect can be obtained by dividing the filter into a plurality of chips, mounting the chips on the same package or on different packages, and thereafter connecting them each other.

As described above, a feature of the present invention is that a plurality of surface acoustic wave resonators are connected in series and matching circuits for external loads are disposed at input and output terminals. In addition, capacities are introduced between coupling parts between resonators and the common earth to facilitate the synthesis of a steep frequency response. Furthermore, the resonance frequencies of resonators are partially or entirely staggered to synthesize a more complicated frequency response. The resonators and the common earth capacity with respect to the ground may be formed on the same substrate by using patterns. It is evident that identical function can be obtained by mutually connecting resonators and capacities formed on different chips by means of bonding wires or the like.

We claim:

1. A surface acoustic wave filter comprising:
    a plurality of one-port surface acoustic wave resonators made with interdigital electrodes formed on one surface of a substrate and connected in series;
    an earth metal conductor formed on another surface of the substrate corresponding to an input resonator and an output resonator among said plurality of one-port surface acoustic wave resonators;
    a first matching circuit for matching with an external load connected between an input terminal of said input resonator and said earth metal conductor; and
    a second matching circuit for matching with an external load connected between an output terminal of said output resonator and said earth metal conductor.

2. A surface acoustic wave filter according to claim 1, wherein a resonant frequency of at least one of said plurality of one-port surface acoustic wave resonators differs from resonant frequencies of the other of said one-port surface acoustic wave resonators.

3. A surface acoustic wave filter according to claim 1, wherein said plurality of one-port surface acoustic wave resonators are formed on the one surface of a single substrate, and said earth metal conductor is formed in common with said electrodes on the other surface of said single substrate.

4. A surface acoustic wave filter according to claim 3, further comprising static capacitance means disposed between coupling parts between said plurality of one-port surface acoustic wave resonators connected in series and said earth conductor and/or between said input and output terminals and said earth conductor.

5. A surface acoustic wave filter according to claim 1, wherein the substrate is a piezoelectric substrate, said plurality of one-port surface acoustic wave resonators are formed on the one surface of said single piezoelectric substrate and said earth conductor is formed on the other surface of said piezoelectric substrate.

6. A surface acoustic wave filter according to claim 5, further comprising static capacitance means disposed between coupling parts between said plurality of one-port surface acoustic wave resonators connected in series and said earth metal conductor and/or between said input and output terminals and said earth conductor.

* * * * *